(12) United States Patent
Liu

(10) Patent No.: US 7,279,784 B2
(45) Date of Patent: Oct. 9, 2007

(54) SEMICONDUCTOR PACKAGE

(75) Inventor: Sheng Tsung Liu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 106 days.

(21) Appl. No.: 11/049,863

(22) Filed: Feb. 4, 2005

(65) Prior Publication Data

US 2005/0127494 A1    Jun. 16, 2005

(51) Int. Cl.
*H01L 23/02* (2006.01)

(52) U.S. Cl. .................. 257/686; 257/696; 257/735; 257/779; 257/E23.047; 257/E23.048; 257/E23.085

(58) Field of Classification Search ............... 257/686, 257/E23.048, E23.042, E23.047
See application file for complete search history.

(56) References Cited

U.S. PATENT DOCUMENTS

| | | | |
|---|---|---|---|
| 5,451,716 A | * | 9/1995 | Hasegawa et al. .......... 174/527 |
| 5,835,988 A | * | 11/1998 | Ishii ............................ 257/684 |
| 6,169,323 B1 | * | 1/2001 | Sakamoto ................... 257/667 |
| 6,424,031 B1 | | 7/2002 | Glenn |
| 6,433,418 B1 | * | 8/2002 | Fujisawa et al. ............ 257/696 |
| 6,730,544 B1 | * | 5/2004 | Yang ........................... 438/110 |
| 6,750,545 B1 | * | 6/2004 | Lee et al. ..................... 257/777 |
| 2002/0100963 A1 | * | 8/2002 | Suzuki et al. ............... 257/678 |

* cited by examiner

*Primary Examiner*—Minhloan Tran
*Assistant Examiner*—Leslie Pilar Cruz

(57) ABSTRACT

A semiconductor package mainly includes a semiconductor chip and a plurality of L-shaped leads arranged at the periphery of the semiconductor chip. Each of the L-shaped leads has an inner lead portion exposed out of the lower surface of the semiconductor package and an outer lead portion formed substantially parallel to and adjacent to one of the side surfaces of the semiconductor package. The semiconductor chip has a plurality of bonding pads electrically coupled to the inner lead portions of the L-shaped leads. The semiconductor package is provided with a package body formed over the semiconductor chip and the inner lead portions of the L-shaped leads.

11 Claims, 5 Drawing Sheets

SEMICONDUCTOR PACKAGE

BACKGROUND OF THE INVENTION

1. Field of the Invention

This invention generally relates to a lead frame package.

2. Description of the Related Art

Lead frame packages have been widely used for a long time in the IC packaging field due to their low manufacturing cost and high reliability. However, as integrated circuit products are becoming faster in speed and smaller in volume, the traditional lead frame packages have been gradually obsolete for some high-efficiency integrated circuit products. Accordingly, ball grid array (BGA) packages and chip scale packages (CSP) have become popular packaging choices. The ball grid array (BGA) packages have been widely used in IC chips having high I/O count and requiring good electrical and thermal efficiencies, e.g. CPU chips and graphic chips. In addition, the chip scale packages (CSP) have been widely used in mobile products; the footprint size, package profile and package weight are major concerns for the chip scale packages (CSP).

However, the lead frame packages still remain their market share since they can provide a cost-effective solution for IC chips having low I/O count. The traditional lead frame packages are not capable of providing a solution for chip scale and low profile packages due to their long inner leads and outer leads. Therefore, the semiconductor packaging industry has developed a leadless package having no outer leads such that the footprint size and the package profile can be greatly reduced.

FIG. 1 shows a cross-sectional view of a leadless package 10, which comprises a plurality of inner leads 11a, a die pad 11b and a chip 12. The inner leads 11a are disposed at the bottom of the leadless package 10 as compared to the conventional gull-wing or J-leaded type package. The die pad 11b is exposed out of the bottom of the leadless package 10 so as to provide a better heat dissipation efficiency. The chip 12 is attached to the die pad 11b by silver epoxy and electrically connected to the plurality of inner leads 11a.

Due to the elimination of the outer leads, the leadless package 10 has the features of low profile and light weight. Furthermore, the length reduction of the lead can also reduce the resistance, conductance and capacitance such that the leadless package 10 is suitably used in RF (radio-frequency) packages operating in several GHz to tens of GHz. Due to the use of existing BOM (bill of materials), the leadless package is a cost-effective package. All the above-mentioned properties make the leadless packages very suitable for use in telecommunication products (e.g. cellular phones), portable products (e.g. personal digital assistant (PDA)), digital cameras, and information appliance (IA).

Typically, the leadless package 10 is mounted on a substrate 16, e.g. a printed circuit board, by conventional surface mount technology (SMT). More specifically, the inner leads 11a exposed out of the bottom of the leadless package 10 are respectively bonded to a plurality of corresponding pads 18, formed on the printed circuit board 16, by solder 14. In the conventional surface mount technology (SMT) for mounting the leadless package 10 to the substrate 16, there exists a problem that the area of the inner leads 11a exposed out of the bottom of the leadless package 10 is too small and therefore causes poor solder connection and poor reliability. Although the solder fillet height can be increased by increasing the thickness of the leads 11a, the thickness of the leads 11a may be generally limited to around 0.15 mm due to the low profile of the leadless package. As shown in FIG. 1, the height of the inner lead 11a exposed out of the side wall of the package 10 is only about 0.15 mm for solder connection such that the solder connection is not solid enough.

SUMMARY OF THE INVENTION

It is an object of the present invention to provide a semiconductor package in which the solder fillet height can be effectively increased without increasing the overall thickness of the package itself, thereby increasing the strength of the solder connection and overcoming or at least improving the above-mentioned problem in the prior art.

The semiconductor package according to one embodiment of the present invention comprises a semiconductor chip and a plurality of L-shaped leads arranged at the periphery of the semiconductor chip. Each of the L-shaped leads has an inner lead portion exposed out of the lower surface of the semiconductor package and an outer lead portion formed substantially parallel to and adjacent to one of the side surfaces of the semiconductor package. The semiconductor chip has a plurality of bonding pads electrically coupled to the inner lead portions of the L-shaped leads. The semiconductor package is provided with a package body formed over the semiconductor chip and the inner lead portions of the L-shaped leads.

The semiconductor package according to another embodiment of the present invention comprises a semiconductor chip and a plurality of J-shaped leads arranged at the periphery of the semiconductor chip. Each of the J-shaped leads has an inner lead portion exposed out of the lower surface of the semiconductor package and an outer lead portion, wherein the outer lead portion has a terminal portion adjacent to one of the side surfaces of the semiconductor package. The semiconductor chip has a plurality of bonding pads electrically coupled to the inner lead portions of the J-shaped leads. The semiconductor package is provided with a package body formed over the semiconductor chip and the inner lead portions of the J-shaped leads.

The L-shaped leads (or J-shaped leads) exposed out of the bottom of the semiconductor package are respectively bonded to a plurality of corresponding pads on a printed circuit board by solder when the above semiconductor package is attached on a substrate, e.g. a printed circuit board, by surface mount technology (SMT). Compared to the conventional leadless package, the outer lead portion of the L-shaped lead (or J-shaped lead) according to the present invention can effectively increase the solder fillet height while the overall thickness of the semiconductor package according to the present invention is kept close to that of the above-mentioned conventional leadless package. Although the outer lead portion of the L-shaped lead (or J-shaped lead) according to the present invention may slightly increase the overall volume of the semiconductor package, the footprint area of the outer lead portion will not cause great effects upon the layout of the printed circuit board. Further, the semiconductor package according to the present invention can be obtained by lengthening the leads of the conventional lead frame and then punching and cutting the lengthened leads so as to form the L-shaped leads (or J-shaped leads). Therefore, the semiconductor package according to the present invention can utilize existing BOM (bill of materials) such that it has high price competitiveness.

The semiconductor package according to the present invention further comprises a plurality of grooves each formed on the side surface or upper surface of the semiconductor package for accommodating a part of the outer lead portion of the L-shaped lead or J-shaped lead. In addition, the semiconductor package according to the present invention further comprises a die pad for supporting the semiconductor chip.

The present invention also provides a multichip module which comprises a lower semiconductor package and an upper semiconductor package stacked on the lower semiconductor package, wherein the structure of each semiconductor package here is substantially identical to that of the above-mentioned one. The multichip module is characterized by that the upper semiconductor package is disposed upon the lower semiconductor package such that the L-shaped leads (or J-shaped leads) of the upper semiconductor package are mechanically and electrically connected to those of the lower semiconductor package. More specifically, the outer lead portions of the L-shaped leads (or J-shaped leads) of the upper semiconductor package are soldered to those of the lower semiconductor package.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
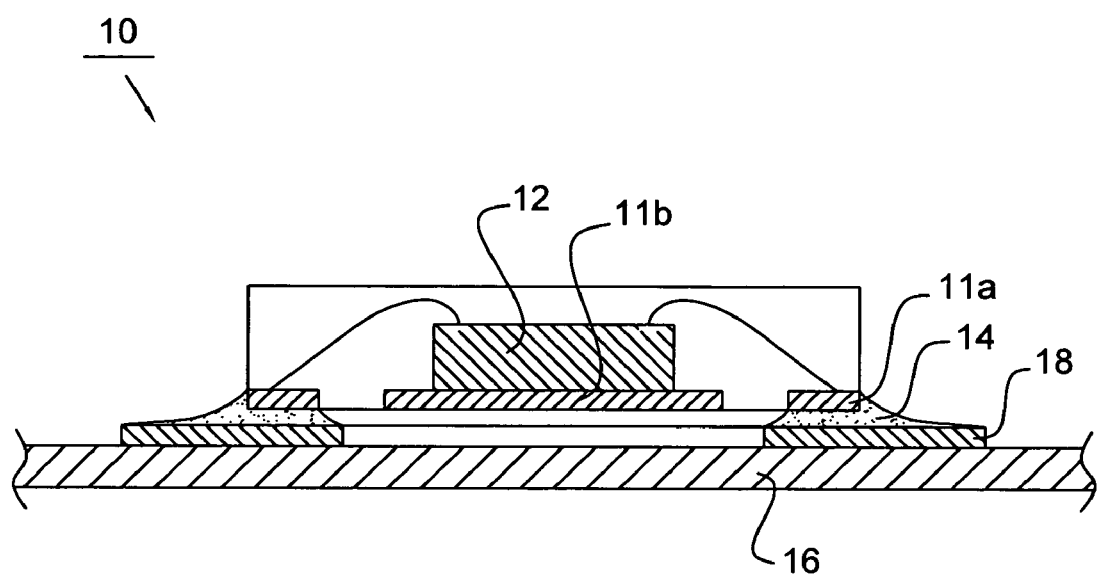
FIG. 1 is a cross-sectional view of a conventional leadless package mounted on an external substrate.
Figure 2:
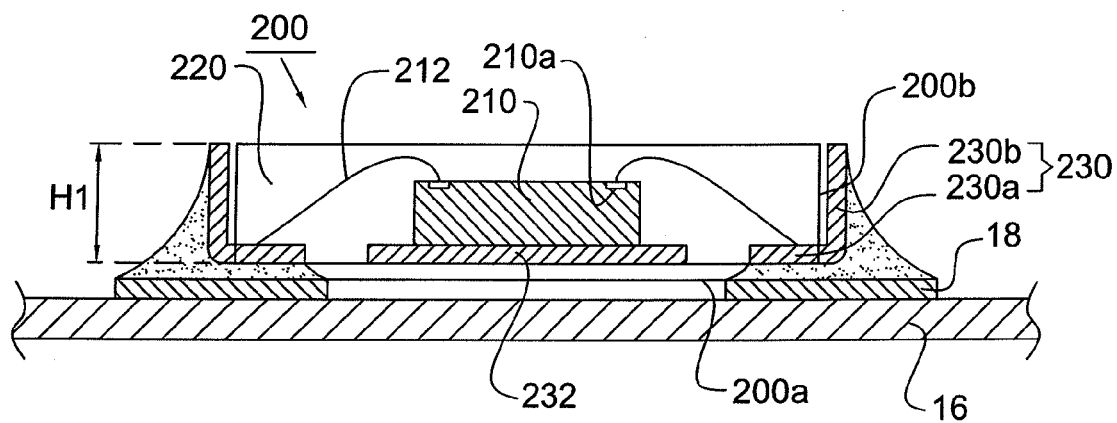
FIG. 2 is a cross-sectional view of a semiconductor package according to one embodiment of the present invention wherein the semiconductor package is mounted on an external substrate.

FIG. 2 shows a semiconductor package 200 according to one embodiment of the present invention. The semiconductor package 200 comprises a semiconductor chip 210 attached to a die pad 232 by a conductive or nonconductive adhesive, e.g. epoxy adhesive (not shown). The semiconductor chip 210 has a plurality of bonding pads 210a disposed on its active surface, wherein the bonding pads 210a are electrically connected to a plurality of L-shaped leads 230 through a plurality of bonding wires 212. The L-shaped leads 230 are arranged at the periphery of the semiconductor chip 210. Each L-shaped lead 230 has an inner lead portion 230a exposed out of the lower surface 200a of the semiconductor package and an outer lead portion 230b extending from the inner lead portion 230a and exposed out of the semiconductor package. The outer lead portion 230b is formed substantially parallel to and adjacent to the side surface 200b of the semiconductor package. A package body 220 is formed over the semiconductor chip 210 and the inner lead portions 230a of the plurality of L-shaped leads 230. The die pad 232 and the inner lead portions 230a of the plurality of L-shaped leads 230 are exposed out of the bottom of the package body 220.

Figure 3:
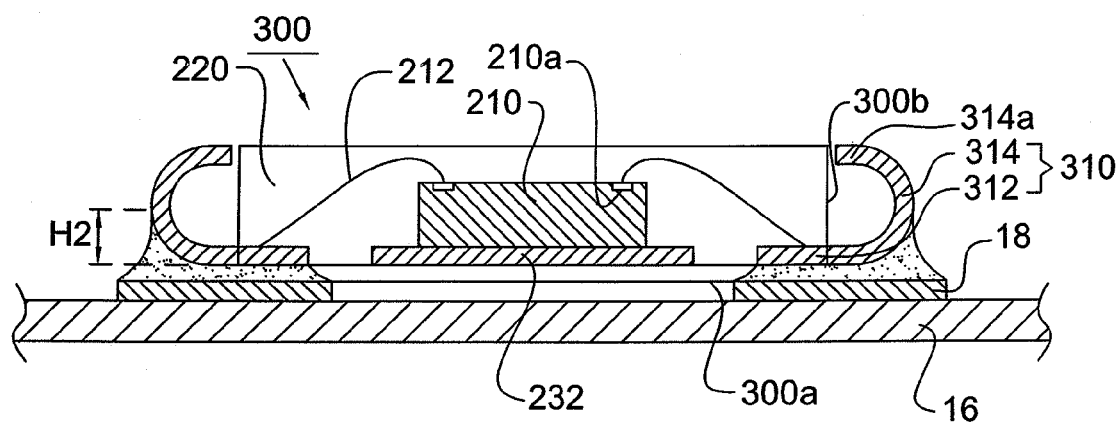
FIG. 3 is a cross-sectional view of a semiconductor package according to another embodiment of the present invention wherein the semiconductor package is mounted on an external substrate.

FIG. 3 shows a semiconductor package 300 according to another embodiment of the present invention. The semiconductor package 300 is substantially identical to the semiconductor package 200 shown in FIG. 2 except that the plurality of L-shaped leads 230 are replaced by a plurality of J-shaped leads 310. Each J-shaped lead 310 has an inner lead portion 312 exposed out of the lower surface 300a of the semiconductor package and an outer lead portion 314 extending from the inner lead portion 312 and exposed out of the semiconductor package, wherein the outer lead portion 314 has a terminal portion 314a adjacent to the side surface 300b of the semiconductor package.

The semiconductor package 200 (or semiconductor package 300) can be mounted on an external substrate, e.g. a printed circuit board 16, by surface mount technology (SMT). In the mounting process, a solder paste pattern is firstly printed on the printed circuit board 16 by screen print method and positionally corresponds to the inner lead portions 230a of the L-shaped leads 230 (or the inner lead portions 312 of the J-shaped leads 310), which are exposed out of the bottom of the semiconductor package 200 (or semiconductor package 300). Secondly, the semiconductor package 200 (or semiconductor package 300) is positioned and then mounted on the printed circuit board 16 by a reflow process in the surface mount technology (SMT). It could be understood that the inner lead portions 230a of the L-shaped leads 230 (or the inner lead portions 312 of the J-shaped leads 310) exposed out of the bottom of the semiconductor package 200 (or semiconductor package 300) can also be firstly applied with solder pastes and then be bonded to the substrate.

Referring to FIG. 2 and FIG. 3, the inner lead portions 230a of the L-shaped leads 230 (or the inner lead portions 312 of the J-shaped leads 310) exposed out of the bottom of the semiconductor package 200 (or semiconductor package 300) are respectively bonded to a plurality of corresponding pads 18, which are formed on the printed circuit board 16, by solders. In addition, the solders are used for wetting the outer lead portions 230b of the L-shaped leads 230 (or the outer lead portions 314 of the J-shaped leads 310). As shown in FIG. 2 and FIG. 3, since the outer lead portions 230b of the L-shaped leads 230 (or the outer lead portions 314 of the J-shaped leads 310) can effectively increase the solder fillet height H1, H2, the strength and the reliability of the solder connection between the semiconductor package 200 (or semiconductor package 300) and the printed circuit board 16 can be greatly improved. In addition, it could be understood that the longer the outer lead portion 230b of the L-shaped lead 230 (or the outer lead portions 314 of the J-shaped leads 310) is, the higher the solder fillet height H1, H2 is. However, in view of the manufacturing cost and the thickness of the semiconductor package, the length of the outer lead portions 230b of the L-shaped leads 230 (or the outer lead portions 314 of the J-shaped leads 310) according to the present invention is designed preferably identical to the thickness of the semiconductor package 200 (or semiconductor package 300).

Compared to the conventional leadless package, the outer lead portions 230b of the L-shaped leads 230 (or the outer lead portions 314 of the J-shaped leads 310) can effectively increase the solder fillet height while the overall thickness of the semiconductor package according to the present invention is kept close to that of the above-mentioned conventional leadless package. Although the outer lead portion 230b of the L-shaped leads 230 (or J-shaped leads) according to the present invention may slightly increase the overall volume of the semiconductor package, the footprint area of the outer lead portion 230b will not cause great effects upon the layout of the printed circuit board 16. Further, the semiconductor package according to the present invention can be obtained by lengthening the leads of the conventional lead frame and then punching and cutting the lengthened leads so as to form the L-shaped leads (or J-shaped leads). Therefore, the semiconductor package according to the present invention can utilize existing BOM (bill of materials) such that it has high price competitiveness.

Figure 4:
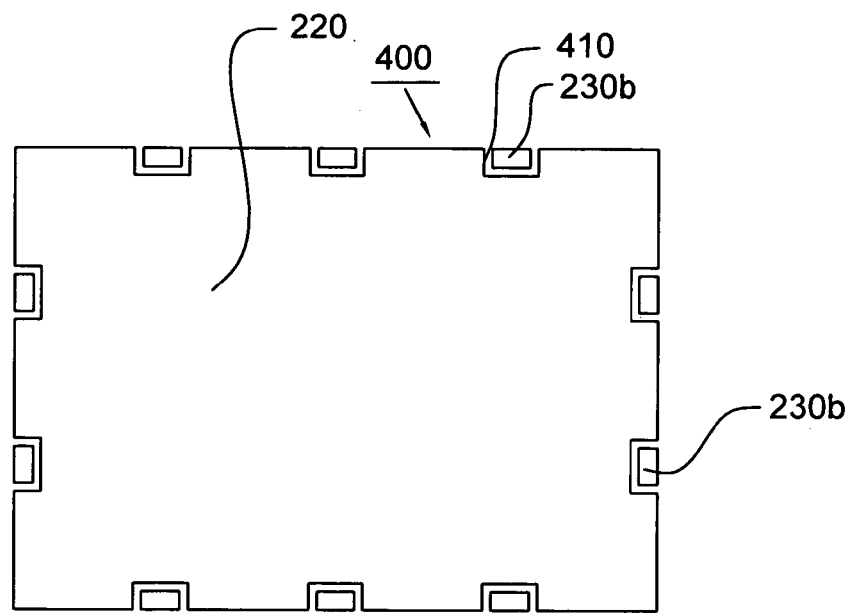
FIG. 4 is a top view of a semiconductor package according to another embodiment of the present invention.

FIG. 4 is a top view of a semiconductor package 400 according to another embodiment of the present invention. The semiconductor package 400 is substantially identical to the semiconductor package 200 shown in FIG. 2 except that a plurality of grooves 410 are formed on the side surface of the semiconductor package for accommodating the outer lead portions 230b of the L-shaped leads 230.

Figure 5:
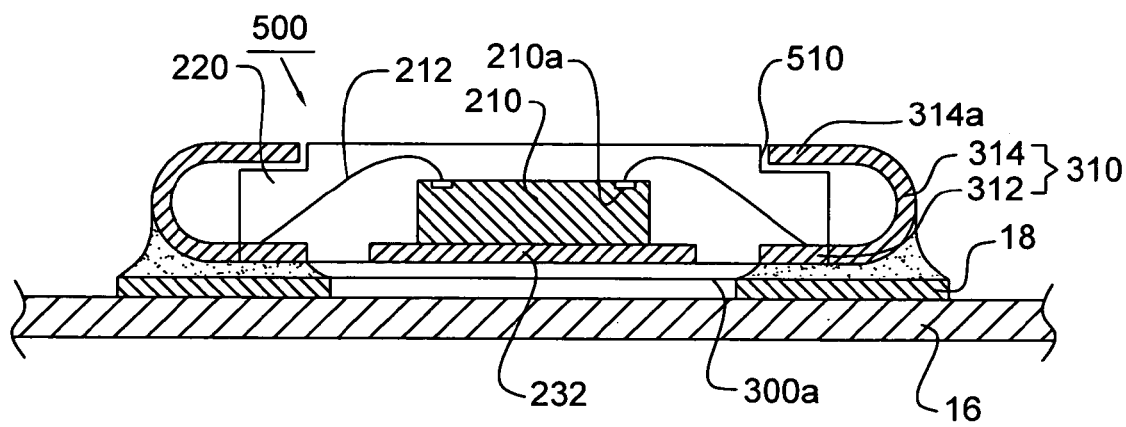
FIG. 5 is a cross-sectional view of a semiconductor package according to another embodiment of the present invention wherein the semiconductor package is mounted on an external substrate.

FIG. 5 shows a cross-sectional view of a semiconductor package 500 according to another embodiment of the present invention. The semiconductor package 500 is substantially identical to the semiconductor package 300 shown in FIG. 3 except that a plurality of grooves 510 are formed on the upper surface of the semiconductor package for accommodating the terminal portions 314a of the J-shaped leads 310.

When the semiconductor package 400 or the semiconductor package 500 is mounted onto a external substrate (e.g. a printed circuit board), the grooves 410 (or 510) can increase the reliability of the outer lead portions 230b of the L-shaped leads 230 (or the outer lead portions 314 of the J-shaped leads 310) and effectively decrease the possibility of dislocation or misalignment of the outer lead portions.

Figure 6:
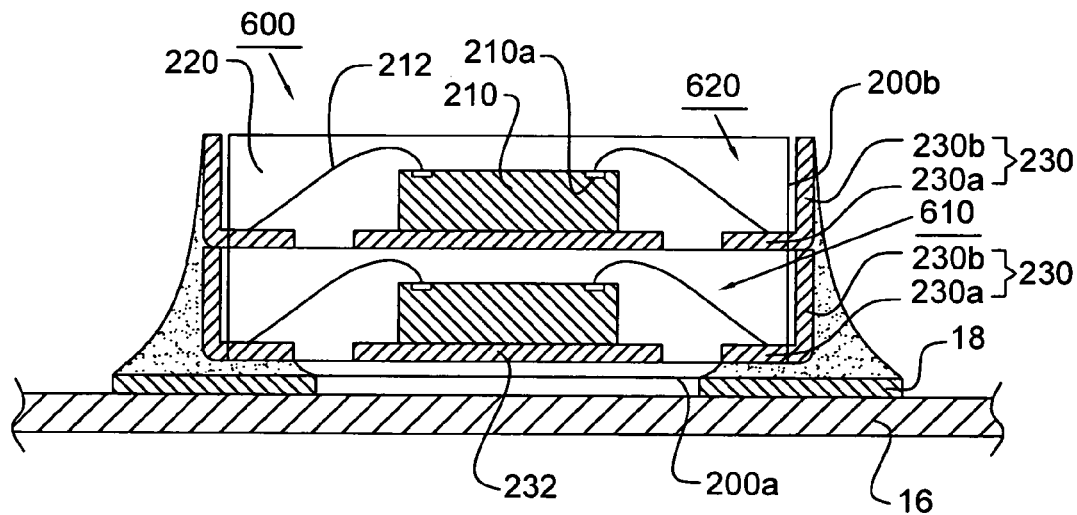
FIG. 6 is a cross-sectional view of a multichip module according to one embodiment of the present invention wherein the multichip module is mounted on an external substrate.

FIG. 6 shows a multichip module 600 according to one embodiment of the present invention. The multichip module 600 comprises a lower semiconductor package 610 and an upper semiconductor package 620 stacked on the lower semiconductor package 610. The semiconductor packages 610, 620 are substantially identical to the semiconductor package 200 shown in FIG. 2. The upper semiconductor package 620 is disposed upon the lower semiconductor package 610 such that the L-shaped leads 230 of the upper semiconductor package 620 are mechanically and electrically connected to those of the lower semiconductor package 610. More specifically, the outer lead portions 230b of the L-shaped leads 230 of the upper semiconductor package 620 are soldered to those of the lower semiconductor package 610.

Figure 7:
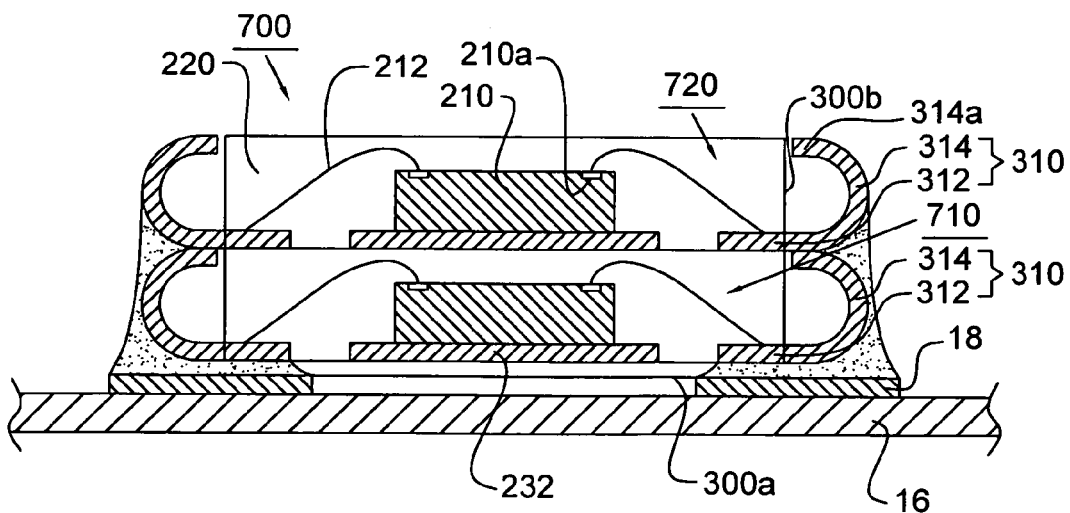
FIG. 7 is a cross-sectional view of a multichip module according to another embodiment of the present invention wherein the multichip module is mounted on an external substrate.
Figure 8:
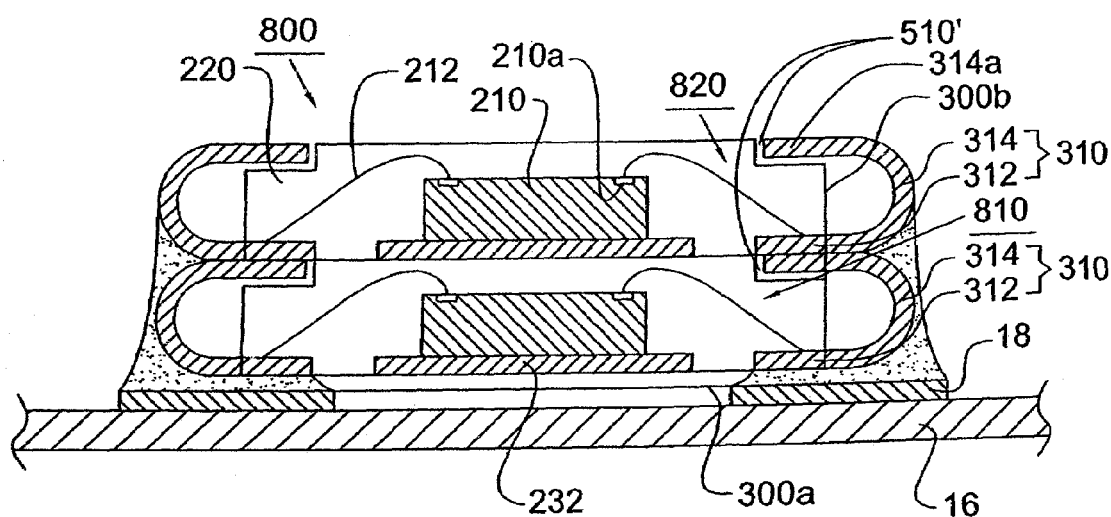
FIG. 8 is a view similar to FIG. 7 showing another embodiment.

FIG. 7 shows a multichip module 700 according to another embodiment of the present invention. The multichip module 700 comprises a lower semiconductor package 710 and an upper semiconductor package 720 stacked on the lower semiconductor package 710. The semiconductor packages 710, 720 are substantially identical to the semiconductor package 300 shown in FIG. 3. The upper semiconductor package 720 is disposed upon the lower semiconductor package 710 such that the J-shaped leads 310 of the upper semiconductor package 720 are mechanically and electrically connected to those of the lower semiconductor package 710. More specifically, the outer lead portions 314 of the J-shaped leads 310 of the upper semiconductor package 720 are soldered to those of the lower semiconductor package 710. In addition, FIG. 8 shows another multichip module 800, which includes a lower semiconductor package 810 and an upper semiconductor package 820 stacked on the lower semiconductor package 810. The semiconductor package 800 is substantially identical to the semiconductor package 700 shown in FIG. 7 except that a plurality of grooves 510' are formed on the upper surface of the semiconductor package for accommodating the terminal portions 314a of the J-shaped leads 310. More detailed, the grooves 510' is substantially identical to the grooves 510 shown in FIG. 5.

Since the upper semiconductor package and the lower semiconductor package can be respectively and independently completed and tested and then mounted together onto a external substrate by the surface mount technology (SMT), the known good die problem can be resolved. Further, the difficulty of testing a multichip module also can be decreased thereby greatly increasing the productivity of the multichip module according to the present invention.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A multichip module for being mounted on a printed circuited board, the multichip module comprising:

an upper semiconductor package and a lower semiconductor package, each having an upper surface, a lower surface opposite to the upper surface and a plurality of side surfaces, and each semiconductor package comprising:

a semiconductor chip having an active surface and a plurality of bonding pads disposed on the active surface;

a plurality of L-shaped leads arranged at the periphery of the semiconductor chip, wherein each of the L-shaped leads has an inner lead portion electrically connected to each bonding pad and exposed out of the lower surface of the semiconductor package and an outer lead portion formed substantially parallel to and adjacent to one of the side surfaces of the semiconductor package; and a package body formed over the semiconductor chip and the inner lead portions of the L-shaped leads; and a plurality of solder regions for respectively bonding the inner lead portions of the L-shaped leads of the lower semiconductor chip to the printed circuit board, wherein the solder of each of said solder regions wets the outer lead portion of one of the L-shaped leads of the lower semiconductor chip as well as the outer lead portion of one of the L-shaped leads of the upper semiconductor chip and has a predetermined fillet height on said outer lead portions of the respective L-shaped leads, thereby improving strength and reliability of the solder connection between the multichip module and the printed circuit board;

wherein the upper semiconductor package is disposed upon the lower semiconductor package such that the L-shaped leads of the upper semiconductor package are mechanically and electrically connected to the L-shaped leads of the lower semiconductor package through the solder in the solder regions.

2. The multichip module as claimed in claim 1, wherein the outer lead portions of the L-shaped leads of the upper semiconductor package are electrically soldered to the outer lead portions of the L-shaped leads of the lower semiconductor package.

3. The multichip module as claimed in claim 1, wherein each of the upper semiconductor package and the lower semiconductor package further comprises a plurality of grooves formed on the side surfaces of the semiconductor package for respectively accommodating the outer lead portions of the L-shaped leads.

4. The multichip module as claimed in claim 1, wherein each of the upper semiconductor package and the lower semiconductor package further comprises a die pad for supporting the semiconductor chip.

5. The multichip module as claimed in claim 1, wherein the fillet height of the solder in each of said solder regions is greater than the height of the outer lead portion of the respective L-shaped lead of the lower semiconductor chip.

6. The multichip module as claimed in claim 1, wherein the fillet height of the solder in each of said solder regions is substantially equal to a combined height of the outer lead portions of the respective L-shaped leads of the upper and lower semiconductor chips.

7. A multichip module for being mounted on a printed circuited board, the multichip module comprising:
   an upper semiconductor package and a lower semiconductor package, each having an upper surface, a lower surface opposite to the upper surface and a plurality of side surfaces, and each semiconductor package comprising:
      a semiconductor chip having an active surface and a plurality of bonding pads disposed on the active surface;
      a plurality of J-shaped leads arranged at the periphery of the semiconductor chip, wherein each of the J-shaped leads has an inner lead portion electrically connected to each bonding pad and exposed out of the lower surface of the semiconductor package and an outer lead portion having a terminal portion adjacent to one of the side surfaces of the semiconductor package; and
      a package body formed over the semiconductor chip and the inner lead portions of the J-shaped leads; and
   a plurality of solder regions for respectively bonding the inner lead portions of the J-shaped leads of the lower semiconductor chip to the printed circuit board, wherein the solder of each of said solder regions wets the outer lead portion of one of the J-shaped leads of the lower semiconductor chip as well as the outer lead portion of one of the J-shaped leads of the upper semiconductor chip and has a predetermined fillet height on said outer lead portions of the respective J-shaped leads, thereby improving strength and reliability of the solder connection between the multichip module and the printed circuit board;
   wherein the upper semiconductor package is disposed upon the lower semiconductor package such that the J-shaped leads of the upper semiconductor package are mechanically and electrically connected to the J-shaped leads of the lower semiconductor package through the solder in the solder regions.

8. The multichip module as claimed in claim 7, wherein the outer lead portions of the J-shaped leads of the upper semiconductor package are electrically soldered to the outer lead portions of the J-shaped leads of the lower semiconductor package.

9. The multichip module as claimed in claim 7, wherein each of the upper semiconductor package and the lower semiconductor package further comprises a plurality of grooves formed on the upper surface of the semiconductor package for respectively accommodating the terminal portions of the outer lead portions.

10. The multichip module as claimed in claim 7, wherein each of the upper semiconductor package and the lower semiconductor package further comprises a die pad for supporting the semiconductor chip.

11. The multichip module as claimed in claim 7, wherein the fillet height of the solder in each of said solder regions is greater than the height of the outer lead portion of the respective J-shaped lead of the lower semiconductor chip.

* * * * *